US011864333B2

(12) United States Patent
Dong

(10) Patent No.: US 11,864,333 B2
(45) Date of Patent: Jan. 2, 2024

(54) DISPLAY DEVICE

(71) Applicant: BOE TECHNOLOGY GROUP CO., LTD., Beijing (CN)

(72) Inventor: Liming Dong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 654 days.

(21) Appl. No.: 16/958,856

(22) PCT Filed: Jul. 9, 2019

(86) PCT No.: PCT/CN2019/095295
§ 371 (c)(1),
(2) Date: Jun. 29, 2020

(87) PCT Pub. No.: WO2021/003672
PCT Pub. Date: Jan. 14, 2021

(65) Prior Publication Data
US 2022/0377918 A1 Nov. 24, 2022

(51) Int. Cl.
H05K 5/02 (2006.01)
H05K 5/00 (2006.01)
(52) U.S. Cl.
CPC ......... H05K 5/0217 (2013.01); H05K 5/0018 (2022.08)
(58) Field of Classification Search
CPC .. H05K 5/0217; H05K 5/0018; G06F 1/1652; G09F 9/301
See application file for complete search history.

(56) References Cited

U.S. PATENT DOCUMENTS 9,940,892 B2 * 4/2018 Pang .................. G09G 5/00
10,319,263 B2 6/2019 Lee et al.
10,775,848 B2 9/2020 Kim et al.
11,452,218 B2 * 9/2022 Choi .................. B32B 19/045
2011/0011542 A1 * 1/2011 Kuroi .................. G03B 21/58
160/133
(Continued)

FOREIGN PATENT DOCUMENTS

CN 105096743 A 11/2015
CN 105679185 A 6/2016
(Continued)

Primary Examiner — Sagar Shrestha
(74) Attorney, Agent, or Firm — Scully, Scott, Murphy & Presser, P.C.

(57) ABSTRACT

A display device is provided. The display device includes a first rotating component, a second rotating component, a flexible display panel, and a supporting part. The first rotating component is capable of rotating about a first center line; the second rotating component is capable of rotating about a second center line; the flexible display panel is capable of being wound around the first rotating component, and a first end of the flexible display panel is configured to move away or close to the first rotating component under an action of an external force; the supporting part is capable of being wound around the second rotating component, and a first end of the supporting part being configured to move away or close to the second rotating component under the action of the external force. The flexible display panel and the supporting part have a laminated portion in mutual lamination.

15 Claims, 9 Drawing Sheets

(56) References Cited

U.S. PATENT DOCUMENTS

| | | | |
|---|---|---|---|
| 2013/0016497 A1 | 1/2013 | Anderson | |
| 2015/0340004 A1* | 11/2015 | Pang | G06F 1/1652 |
| | | | 345/205 |
| 2016/0155965 A1* | 6/2016 | Kusuura | G06F 1/1652 |
| | | | 29/829 |
| 2016/0161983 A1* | 6/2016 | Lee | G09F 9/301 |
| | | | 361/749 |
| 2016/0163241 A1 | 6/2016 | Lee et al. | |
| 2017/0013726 A1* | 1/2017 | Han | H05K 5/03 |
| 2017/0301267 A1* | 10/2017 | Cai | H01L 51/56 |
| 2017/0325342 A1* | 11/2017 | Lee | H01L 51/5237 |
| 2018/0110137 A1* | 4/2018 | Kim | H01L 51/5246 |
| 2018/0160554 A1* | 6/2018 | Kang | H01L 51/5237 |
| 2018/0182993 A1* | 6/2018 | Tang | H01L 51/525 |
| 2019/0141843 A1* | 5/2019 | Park | H10K 50/841 |
| 2019/0204874 A1* | 7/2019 | Kim | G09F 9/301 |
| 2020/0043386 A1* | 2/2020 | Kim | G09F 9/301 |
| 2020/0058272 A1* | 2/2020 | Oh | G06F 1/1652 |
| 2020/0394942 A1* | 12/2020 | Kim | G06F 1/1652 |
| 2021/0110792 A1* | 4/2021 | Hong | G09G 5/38 |
| 2021/0272486 A1* | 9/2021 | Khachatryan | G06F 1/1652 |
| 2021/0327311 A1* | 10/2021 | Han | G06F 1/1652 |
| 2021/0337683 A1* | 10/2021 | Han | H05K 5/0217 |

FOREIGN PATENT DOCUMENTS

| | | |
|---|---|---|
| CN | 206541552 U | 10/2017 |
| CN | 107526188 A | 12/2017 |

\* cited by examiner

DISPLAY DEVICE

CROSS-REFERENCE TO RELATED APPLICATIONS

This application is a national phase entry of PCT International Application No. PCT/CN/2019/095295, filed on Jul. 9, 2019. The disclosure of PCT International Application No. PCT/CN/2019/095295 is incorporated by reference herein.

TECHNICAL FIELD

At least one embodiment of the present disclosure relates to a display device.

BACKGROUND

With development of economic society, and fast changing of scientific and technological innovations, flexible display gradually enters life of consumers in recent years; and developing a new-generation flexible display product with long service life, high reliability and good user experience has become an irresistible trend in development of panel industry.

SUMMARY

At least one embodiment of the disclosure relates to a display device.

At least one embodiment of the disclosure provides a display device, comprising: a first rotating component, the first rotating component being capable of rotating about a first center line; a second rotating component, the second rotating component being capable of rotating about a second center line; a flexible display panel, the flexible display panel being capable of being wound around the first rotating component, and a first end of the flexible display panel being configured to move to a position away from the first rotating component from a position close to the first rotating component or to move to a position close to the first rotating component from a position away from the first rotating component under an action of an external force; a supporting part, the supporting part being capable of being wound around the second rotating component, and a first end of the supporting part being configured to move to a position away from the second rotating component from a position close to the second rotating component or to move to a position close to the second rotating component from a position away from the second rotating component under the action of the external force; wherein the flexible display panel and the supporting part have a laminated portion in mutual lamination, and the laminated portion is configured to increase or decrease under the action of the external force.

For example, the flexible display panel includes a first portion unwound around the first rotating component, the supporting part includes a first portion unwound around the second rotating component, and the first portion of the flexible display panel and the first portion of the supporting part are at least partially laminated to each other to form the laminated portion.

For example, at least one of the first rotating component, the second rotating component, the flexible display panel and the supporting part is configured to receive the external force.

For example, at least one of the flexible display panel and the supporting part is configured to receive the external force, and the first rotating component is configured to rotate with movement of the first end of the flexible display panel, and the second rotating component is configured to rotate with movement of the first end of the supporting part.

For example, at least one of the first rotating component and the second rotating component is configured to receive the external force, and the first end of the flexible display panel is configured to move with rotation of the first rotating component, and the first end of the supporting part is configured to move with rotation of the second rotating component.

For example, an elastic modulus of the flexible display panel is smaller than that of the supporting part.

For example, the first portion of the flexible display panel and the first portion of the supporting part are at least partially in contact, and the first end of the flexible display panel is in contact with the first end of the supporting part.

For example, the first center line and the second center line are parallel to each other.

For example, the first rotating component and the second rotating component are butted with each other through a portion of the flexible display panel and a portion of the supporting part that are located between the first rotating component and the second rotating component.

For example, the flexible display panel further includes a second portion wound around the first rotating component, and the supporting part further includes a second portion wound around the second rotating component; the second portion of the flexible display panel is configured to be gradually wound around the first rotating component upon the first end of the flexible display panel moving to a position close to the first rotating component from a position away from the first rotating component, the second portion of the supporting part is configured to be gradually wound around the second rotating component upon the first end of the supporting part moving to a position close to the second rotating component from a position away from the rotating component.

For example, the display device further comprises a housing, wherein the housing has an opening; the laminated portion is configured to be pulled out from the opening.

For example, the first rotating component and the second rotating component are located in the housing.

For example, the housing includes an opening forming portion, the opening forming portion is configured to form the opening, and one side of the opening forming portion close to the supporting part includes a magnetic material.

For example, the first rotating component includes a first circular shaft, the second rotating component includes a second circular shaft, and a diameter of the first circular shaft is smaller than that of the second circular shaft.

For example, rigidity of the supporting part is greater than that of the flexible display panel.

For example, a material of the supporting part includes a metal material.

For example, the flexible display panel includes a back film, the back film is located on a non-display side of the flexible display panel, and the non-display side and a display side of the flexible display panel are opposite to each other; the back film is in contact with the supporting part.

For example, the back film includes a magnetic material; the supporting part includes a magnetic material; the back film and the supporting part are capable of being laminated to each other under an action of an attraction force.

For example, the back film includes a magnetic material pattern.

For example, the magnetic material pattern includes a plurality of magnetic stripes parallel to each other.

For example, the plurality of magnetic stripes are arranged along a first direction, each of the plurality of magnetic stripes extends along a second direction; or, each of the plurality of magnetic stripes extends along the first direction, the plurality of magnetic stripes are arranged along the second direction, and the first direction intersects with the second direction; the supporting part includes two supporting pieces extending along the first direction and a plurality of connecting pieces connecting the two supporting pieces.

For example, the two supporting pieces are parallel to each other, and the plurality of connecting pieces are parallel to each other.

For example, the second direction is perpendicular to the first direction.

For example, the second rotating component includes a magnetic material, and the second rotating component and the supporting part are capable of being laminated to each other under an action of an attraction force.

For example, the back film includes a first toothed rack structure, and the supporting part includes a second toothed rack structure, and the first toothed rack structure and the second toothed rack structure are engaged with each other.

For example, the display device further comprises a connecting component, wherein the connecting component is located outside the housing, and the connecting component is connected with the first end of the flexible display panel and the first end of the supporting part.

For example, a size of the connecting component in a third direction is greater than that of the opening in the third direction, and the third direction is a direction perpendicular to a plane where the laminated portion is located.

For example, the first rotating component includes a first portion configured to wind the flexible display panel and a second portion configured not to wind the flexible display panel, the second rotating component includes a first portion configured to wind the supporting part and a second portion configured not to wind the supporting part, the second portion of the first rotating component includes a first gear, the second portion of the second rotating component includes a second gear, and the first gear and the second gear are engaged with each other.

For example, the display device further comprises a knob connected with the first gear or the second gear.

For example, the first rotating component and the second rotating component have opposite rotation directions, and the first portion of the flexible display panel and the first portion of the supporting part are located between the first rotating component and the second rotating component.

For example, the first rotating component and the second rotating component have a same rotation direction, the first portion of the flexible display panel and the first portion of the supporting part are located on a same side of the first rotating component and the second rotating component.

For example, a side face of the first end of the flexible display panel is flush with that of the first end of the supporting part.

For example, the first end of the flexible display panel and the first end of the supporting part are configured to move along a first direction, and the first direction is a direction perpendicular to the first center line and the second center line within a plane where the laminated portion is located.

For example, the first end of the flexible display panel and the first end of the supporting part are configured to move simultaneously.

For example, the first rotating component and the second rotating component are configured to move simultaneously.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise specified, the technical terms or scientific terms used in the disclosure have normal meanings understood by those skilled in the art. The words "first", "second" and the like used in the disclosure do not indicate the sequence, the number or the importance but are only used for distinguishing different components. The word "comprise", "include" or the like only indicates that an element or a component before the word contains elements or components listed after the word and equivalents thereof, not excluding other elements or components. The words "connection", "connected" and the like are not limited to physical or mechanical connection but may include electrical connection, either directly or indirectly. The words "on", "beneath", "left", "right" and the like only indicate the relative position relationship which is correspondingly changed when the absolute position of a described object is changed.

In a field of a flexible display panel currently under research, a rollable panel is an important technical development direction. When a flexible display panel is rolled, the smaller the thickness is, the higher the rollability is; but when the flexible display is unfolded, the panel has a large amount of warpage due to small thickness under the action of rolling inertia; and since a bottom of the panel lacks of a rigid support, it is very inconvenient for the user to operate during use, and user experience is poor.

Figure 1A:
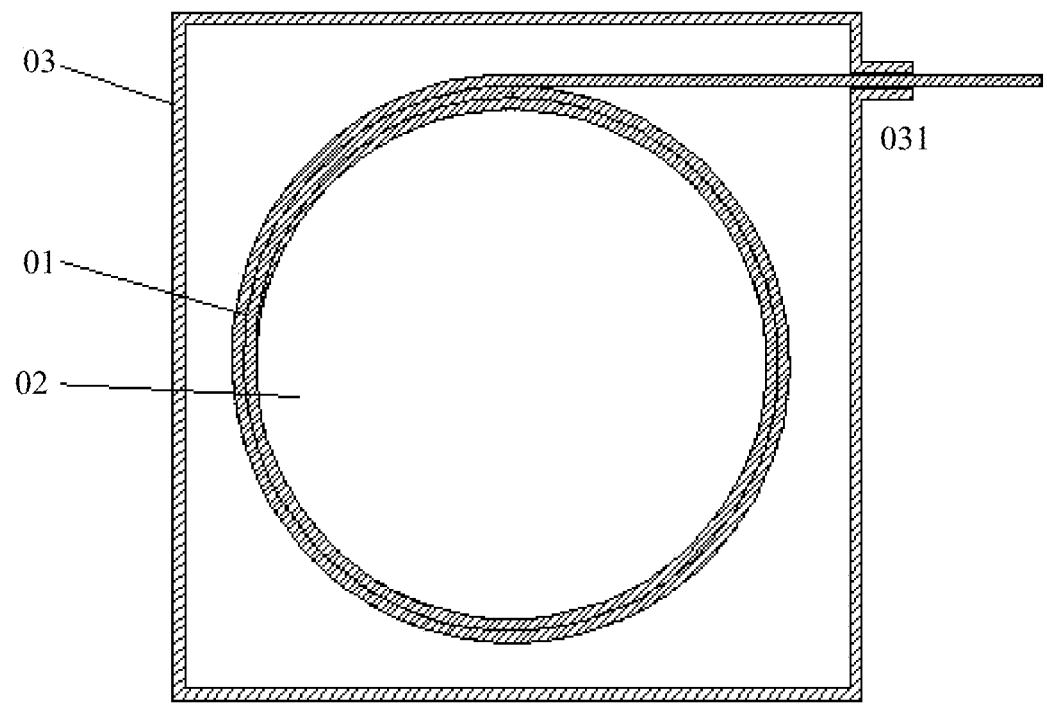
FIG. 1A is a schematic diagram of a display device.

FIG. 1A is a schematic diagram of a display device. As shown in FIG. 1A, the display device comprises a flexible display panel 01, a rotating shaft 02 and a housing 03. The housing 03 has an opening 031. The flexible display panel 01 can be pulled out or retracted into the housing 03 through the opening 031. The rotating shaft 02 can rotate clockwise or anticlockwise. For example, when the flexible display panel 01 is pulled outwards, the rotating shaft 02 rotates clockwise; when the flexible display panel 01 is retracted inwards, the rotating shaft 02 rotates anticlockwise. The flexible display panel 01 is in close contact with the rotating shaft 02 in a rolled state.

Figure 1B:
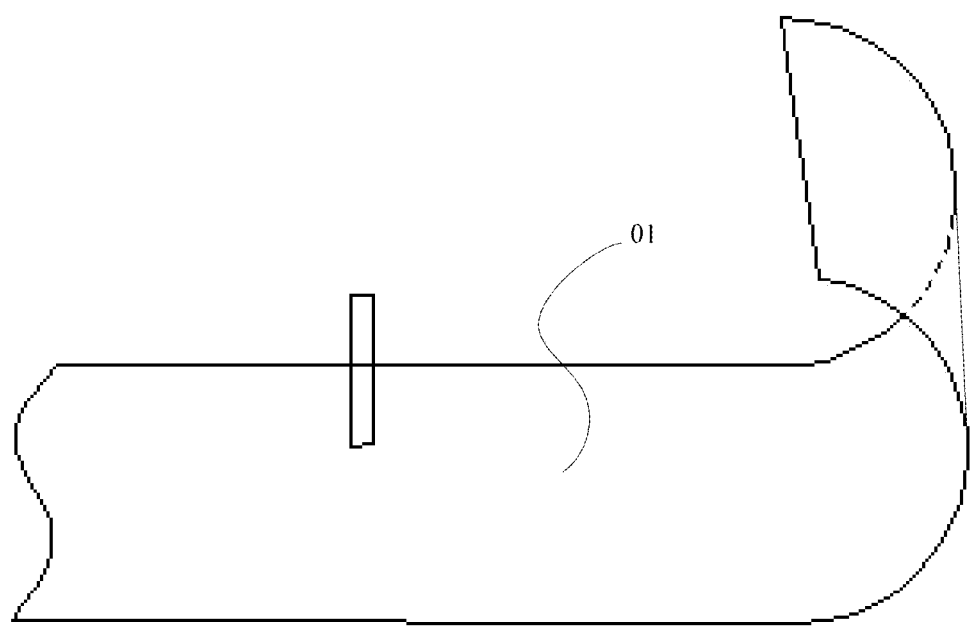
FIG. 1B is a schematic diagram of a flexible display panel in an unfolded state.

FIG. 1B is a schematic diagram when a flexible display panel in an unfolded state. Since the flexible display panel is thinner, and there is rolling inertia, when being unfolded, the flexible display panel may have different degrees of rolling, especially the rolling degree of an edge position is more severe; so it is very inconvenient for the user to operate during use, and the user experience is poor.

Figure 2:
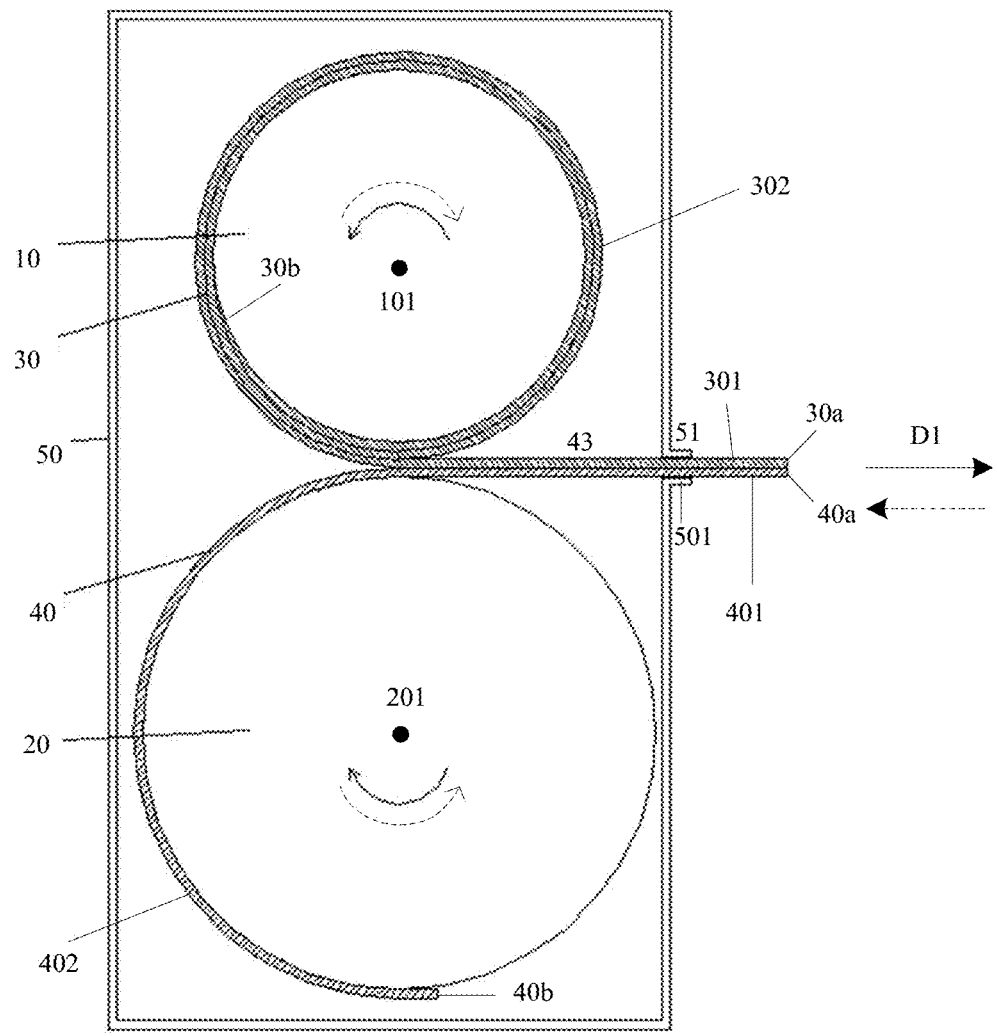
FIG. 2 is a schematic diagram of a display device provided by an embodiment of the present disclosure.

FIG. 2 is a schematic diagram of a display device provided by an embodiment of the present disclosure. As shown in FIG. 2, the display device comprises: a first rotating component 10, a second rotating component 20, a flexible display panel 30 and a supporting part 40. The first rotating component 10 can rotate about a first center line 101. The second rotating component 20 can rotate about a second center line 201. The flexible display panel 30 may be wound around the first rotating component 10, and a first end 30a of the flexible display panel 30 is configured to move to a position away from the first rotating component 10 from a position close to the first rotating component 10 or to move to a position close to the first rotating component 10 from a position away from the first rotating component 10 under the action of an external force. For example, the first end 30a of the flexible display panel 30 is configured to gradually get close to the first rotating component 10 or to gradually move away from the first rotating component 10 under the action of the external force. The supporting part 40 may be wound around the second rotating component 20, and a first end 40a of the supporting part 40 is configured to move to a position away from the second rotating component 20 from a position close to the second rotating component 20 or to move to the position close to the second rotating component 20 from the position away from the second rotating component 20. For example, the first end 40a of the supporting part 40 is configured to gradually get close to the second rotating component 20 or to gradually move away from the second rotating component 20 under the action of the external force.

As shown in FIG. 2, the flexible display panel 30 and the supporting part 40 have a laminated portion 43 for mutual lamination, and the laminated portion 43 is configured to increase or decrease under the action of the external force. For example, the laminated portion 43 is configured to gradually increase or decrease under the action of the external force. As shown in FIG. 2, when the first rotating component 10 rotates anticlockwise, the second rotating component 20 rotates clockwise, and the laminated portion 43 moves rightwards, the laminated portion 43 gradually increases. As shown in FIG. 2, when the first rotating component 10 rotates clockwise, the second rotating component 20 rotates anticlockwise, and the laminated portion 43 moves leftwards, the laminated portion 43 gradually decreases.

For example, the external force may act on at least one of the flexible display panel 30, the supporting part 40, the first rotating component 10 and the second rotating component 20. That is, at least one of the flexible display panel 30, the supporting part 40, the first rotating component 10 and the second rotating component 20 is configured to receive the external force.

For example, the external force acts on at least one of the flexible display panel 30 and the supporting part 40, that is, at least one of the flexible display panel 30 and the supporting part 40 is configured to receive the external force. The first rotating component 10 is configured to rotate with movement of the first end 30a of the flexible display panel 30, and the second rotating component 20 is configured to rotate with movement of the first end 40a of the supporting part 40. For example, the external force may act on at least one of the first end 30a of the flexible display panel 30, and the first end 40a of the supporting part 40. For example, a user may push and pull at least one of the flexible display panel 30 and the supporting part 40 with hand, so that the first end 30a of the flexible display panel 30 and the first end 40a of the supporting part 40 move, and meanwhile, the first rotating component 10 and the second rotating component 20 rotate to wind the flexible display panel 30 and the supporting part 40, respectively.

For example, the external force acts on at least one of the first rotating component 10 and the second rotating component 20, that is, at least one of the first rotating component 10 and the second rotating component 20 is configured to receive the external force. The first end 30a of the flexible display panel 30 is configured to move with rotation of the first rotating component 10, and the first end 40a of the supporting part 40 is configured to move with rotation of the second rotating component 20. In some embodiments, at least one of the first rotating component 10 and the second rotating component 20 may further be configured with a knob, and when the user turns the knob with hand, the first rotating component 10 and the second rotating component 20 can be driven to rotate, thereby realizing movement of the first end 30a of the flexible display panel 30 and the first end 40a of the supporting part 40. Of course, the knob may not be provided, and at least one of the first rotating component 10 and the second rotating component 20 may be rotated by other driving elements such as a motor, etc.

For example, the first end 30a of the flexible display panel 30 is configured to move with the rotation of the first rotating component 10 to gradually get close to the first rotating component 10 or to gradually move away from the first rotating component 10. The first end 40a of the supporting part 40 is configured to move with the rotation of the second rotating component 20 to gradually get close to the second rotating component 20 or to gradually move away from the second rotating component 20.

As shown in FIG. 2, the flexible display panel 30 includes a first portion 301 unwound around the first rotating component 10, the supporting part 40 includes a first portion 401 unwound around the second rotating component 20, and the first portion 301 of the flexible display panel 30 and the first portion 401 of the supporting part 40 are at least partially laminated to each other to form the laminated portion 43.

In the display device provided by the embodiment of the present disclosure, the first portion 301 of the flexible display panel 30 and the first portion 401 of the supporting part 40 are at least partially laminated to each other, and the supporting part 40 supports the flexible display panel 30, and thus, the flexible display panel 30 has higher rollability when being rolled, and less warpage when being unfolded, which is conducive to improving a display effect and user experience. The display device provided by the embodiment of the present disclosure can improve flatness when the flexible display panel is unfolded and the rollability when it is rolled.

In the display device provided by the embodiment of the present disclosure, an elastic modulus of the flexible display panel 30 is smaller than that of the supporting part 40. When being rolled, the flexible display panel 30 is separated from the supporting part 40 having an elastic modulus bigger than that of the flexible display panel, to achieve better rolling. When being pulled out from the display device, the flexible display panel 30 is laminated to the supporting part 40, and when the flexible display panel 30 is unfolded, warpage caused by the rolling inertia is reduced, so that the flexible display panel 30 has better flatness.

For example, the flexible display panel 30 is in close contact with the first rotating component 10 in the rolled state. The supporting part 40 is in close contact with the second rotating component 20 in the rolled state. The first rotating component 10 is used for storing the flexible display panel 30, and the second rotating component 20 is used for storing the supporting part 40.

For example, the flexible display panel 30 and the supporting part 40 are configured to be gradually laminated when the first end 30a of the flexible display panel 30 moves to the position away from the first rotating component 10 from the position close to the first rotating component 10 and the first end 40a of the supporting part 40 moves to the position away from the first rotating component 20 from the position close to the second rotating component 20. For example, the flexible display panel 30 and the supporting part 40 are further configured to be gradually separated when the first end 30a of the flexible display panel 30 moves to the position close to the first rotating component 10 from the position away from the first rotating component 10 and the first end 40a of the supporting part 40 moves to the position close to the second rotating component 20 from the position away from the second rotating component 20.

For example, the flexible display panel 30 and the supporting part 40 are configured to be gradually laminated when the first end 30a of the flexible display panel 30 gradually moves away from the first rotating component 10 and the first end 40a of the supporting part 40 gradually moves away from the second rotating component 20. For example, the flexible display panel 30 and the supporting part 40 are further configured to be gradually separated when the first end 30a of the flexible display panel 30 gradually gets close to the first rotating component 10 and the first end 40a of the supporting part 40 gradually gets close to the second rotating component 20.

For example, rigidity of the supporting part 40 is greater than that of the flexible display panel 30, so that the flexible display panel 30 has a rigid support, which facilitates operation of the user, and improves the user experience. For example, the rigidity refers to the ability of a material or a structure to resist elastic deformation under stress.

For example, as shown in FIG. 2, in order to make the supporting part better play a role of supporting, the first portion 301 of the flexible display panel 30 is at least partially in contact with the first portion 401 of the supporting part 40. For example, the first end 30a of the flexible display panel 30 is in contact with the first end 40a of the supporting part 40.

For example, as shown in FIG. 2, the flexible display panel 30 further includes a second portion 302 wound around the first rotating component 10, and the supporting part 40 further includes a second portion 402 wound around the second rotating component 20. For example, in the embodiment of the present disclosure, the first portion 301 and the second portion 302 of the flexible display panel 30 can be mutually transformed, and a portion of the flexible display panel 30 wound around the first rotating component 10 is called the second portion 302, and a portion of the flexible display panel 30 unwound around the first rotating component 10 is called the first portion 301, and when the flexible display panel 30 and the supporting part 40 move, a proportion of the first portion 301 and a proportion of the second portion 302 of the flexible display panel 30 change. For example, when the flexible display panel 30 and the supporting part 40 are pushed, the first portion 301 increases, while the second portion 302 decreases, and accordingly, when the flexible display panel 30 and the supporting part 40 are pulled out, the first portion 301 decreases, while the second portion 302 increases. The proportion of the first portion 301 and the proportion of the second portion 302 of the flexible display panel 30 are not limited.

For example, as shown in FIG. 2, the flexible display panel 30 further includes a second end 30b, and the supporting part 40 further includes a second end 40b. For example, the second end 30b of the flexible display panel 30 is connected with the first rotating component 10. For example, the second end 30b of the flexible display panel 30 is fixed onto the first rotating component 10, but is not limited thereto. For example, the second end 40b of the supporting part 40 is connected with the second rotating component 20. For example, the second end 40b of the supporting part 40 is fixed onto the second rotating component 20, but is not limited thereto. As shown in FIG. 2, for example, the second end 30b of the flexible display panel 30 is in contact with the first rotating component 10, and the second end 40b of the supporting part 40 is in contact with the second rotating component 20. For example, the first end 30a and the second end 30b of the flexible display panel 30 are opposite ends of the flexible display panel 30 in the unfolded state. For example, the first end 40a and the second end 40b of the supporting part 40 are two opposite ends of the supporting part 40 in the unfolded state.

For example, as shown in FIG. 2, in order to facilitate structural stability of the display device, the first center line 101 and the second center line 201 are parallel to each other. As shown in FIG. 2, the first center line 101 is a line perpendicular to the drawing paper, and the second center line 201 is a line perpendicular to the drawing paper. The first center line 101 may be a rotation axis of the first rotating component 10, and the second center line 201 may be a rotation axis of the second rotating component 20. When the first rotating component 10 and the second rotating component 20 are circular shafts, the first center line 101 and the second center line 201 may be the center lines of the circular shafts respectively. For example, the first center line 101 and the second center line 201 may be dummy lines.

For example, the flexible display panel 30 is configured to be gradually wound around the first rotating component 10 when the first end 40a of the supporting part 40 gradually gets close to the second rotating component 20, and is configured to be gradually separated from the first rotating component 10 when the first end 40a of the supporting part 40 gradually moves away from the second rotating component 20.

For example, as shown in FIG. 2, the display device further includes a housing 50, the housing having an opening 51; the laminated portion 43 of the flexible display panel 30 and the supporting part 40 which are in mutual lamination may be configured to be pulled out from the opening 51. The laminated portion 43 of the flexible display panel 30 and the supporting part 40 which are in mutual lamination may also be configured to be retracted into the housing 50 from the opening 51.

In some embodiments, in order to improve a space utilization rate, an orthographic projection of the first center line 101 on a bottom surface of the housing 50 and an orthographic projection of the second center line 201 on the bottom surface of the housing 50 may be overlapped.

For example, the flexible display panel 30 and the supporting part 40 are configured to be simultaneously pulled out from the opening 51 so as to be gradually separated from the first rotating component 10 and the second rotating component 20 respectively, and are configured to be simultaneously retracted into the housing 50 from the opening 51 so as to be wound around the first rotating component 10 and the second rotating component 20 respectively.

For example, the first rotating component 10 and the second rotating component 20 are located in the housing 50. When at least one of the first rotating component 10 and the second rotating component 20 is configured with the knob, the knob may be provided outside the housing 50, so as to facilitate the user operation.

For example, the housing 50 includes an opening forming portion 501, the opening forming portion 501 is configured to form an opening 51, and one side of the opening forming portion 501 close to the supporting part 40 includes a magnetic material, so as to utilize an attraction force between the supporting part 40 including the magnetic material and the opening forming portion 501 including the magnetic material when at least one of the flexible display panel 30 and the supporting part 40 stops from being pushed and pulled, so that a structure of the display device is stable, and the flexible display panel 30 may not have unexpected movement due to influences of other forces. For example, when at least one of the flexible display panel 30 and the supporting part 40 is pushed, the flexible display panel 30 and the supporting part 40 can be retracted into the housing 50, and when the at least one of the flexible display panel 30 and the supporting part 40 is pulled, the flexible display panel 30 and the supporting part 40 can be pulled out from the housing 50. Of course, the embodiment of the present disclosure is not limited thereto. In other embodiments, at least one of the first rotating component 10 and the second rotating component 20 may also be rotated to achieve an object that the first end 30a of the flexible display panel 30 gradually gets close to the first rotating component 10 or gradually moves away from the first rotating component 10.

In order to facilitate that the laminated portion 43 of the flexible display panel 30 and the supporting part 40 which are in mutual lamination is repeatedly pulled out and retracted into the housing 50, a part of the laminated portion 43 of the flexible display panel 30 and the supporting part 40 which are in mutual lamination can be located outside the housing 50, or the first end 30a of the flexible display panel 30 and the first end 40a of the supporting part 40 are located outside the opening forming portion 501, but is not limited thereto.

For example, a material of the supporting part 40 includes a metal material. For example, the material of the supporting part 40 includes a magnetic material, but is not limited thereto. For example, the supporting part 40 may be made of metal materials such as stainless steel, Cu, etc. For example, the material of the supporting part 40 includes a non-metallic material. For example, the material of the supporting part 40 includes rubber, and further includes, for example, thermoplastic polyurethanes (TPU), but is not limited thereto.

For example, as shown in FIG. 2, the first rotating component 10 and the second rotating component 20 have opposite rotation directions, and the first portion 301 of the flexible display panel 30 and the first portion 401 of the supporting part 40 are located between the first rotating component 10 and the second rotating component 20. The first portion 301 of the flexible display panel 30 and the first portion 401 of the supporting part 40 are laminated together, which facilitates that the flexible display panel has good flatness when unfolded. Meanwhile, even if the supporting part 40 and the flexible display panel 30 have certain warpage, yet since the flexible display panel 30 and the supporting part 40 have opposite warpage directions, the laminated portion 43 of the flexible display panel 30 and the supporting part 40 which are in mutual lamination may have good flatness, which can facilitate the user operation and improve the user experience. Of course, in other embodiments, the first rotating component 10 and the second rotating component 20 may also have a same rotation direction.

For example, the second rotating component 20 includes a magnetic material, the supporting part 40 includes a magnetic material, and the second rotating component 20 may be laminated to the supporting part 40 under the action of the attraction force, but is not limited thereto.

For example, as shown in FIG. 2, the first end 30a of the flexible display panel 30 and the first end 40a of the supporting part 40 can move along a first direction D1. For example, the first direction D1 may also be regarded as a direction perpendicular to the first center line 101 and the second center line 201 within a plane where the laminated portion is located, but is not limited thereto. In some embodiments, the first direction D1 can also be regarded as a direction perpendicular to a plane formed by the first center line 101 and the second center line 201. For example, the first end 30a of the flexible display panel 30 and the first end 40a of the supporting part 40 move along the first direction D1. For example, the first end of the flexible display panel 30 and the first end of the supporting part 40 are configured to move simultaneously. For example, the first rotating component 10 and the second rotating component 20 are configured to move simultaneously. For example, in the embodiment of the present disclosure, simultaneous movement may refer to synchronous movement, but is not limited thereto. For example, in the embodiment of the present disclosure, the first end of the flexible display panel 30 and the first end of the supporting part 40 move along a same direction.

For example, as shown in FIG. 2, a side face of the first end 30a of the flexible display panel 30 is flush with that of the first end of the supporting part 40.

For example, as shown in FIG. 2, in an initial state, the flexible display panel 30 and the supporting part 40 are wound around the first rotating component 10 and the second rotating component 20 respectively; when the flexible display panel 30 is pulled out, the first rotating component 10 rotates anticlockwise, and the second rotating component 20 rotates clockwise (direction marked by a solid line), and a back film of the flexible display panel 30 and the supporting part 40 are gradually laminated, so that the display panel 30 and the supporting part 40 are combined together. When the flexible display panel is retracted back, the first rotating component 10 rotates clockwise, and the second rotating component 20 rotates anticlockwise (direction marked by a broken line), the flexible display panel 30 and the supporting part 40 are separated under the action of a force, to realize that the flexible display panel 30 is independently wound around the first rotating component 10, and the supporting part 40 is independently wound around the second rotating component 20. The flexible display panel 200 is thinner, and has higher rollability.

For example, as shown in FIG. 2, the flexible display panel 30 is configured to be gradually wound around the first rotating component 10 when the first end 40a of the supporting part 40 gradually gets close to the second rotating component 20, and is configured to be gradually separated from the first rotating component 10 when the first end 40a of the supporting part 40 gradually moves away from the second rotating component 20.

Figure 3:
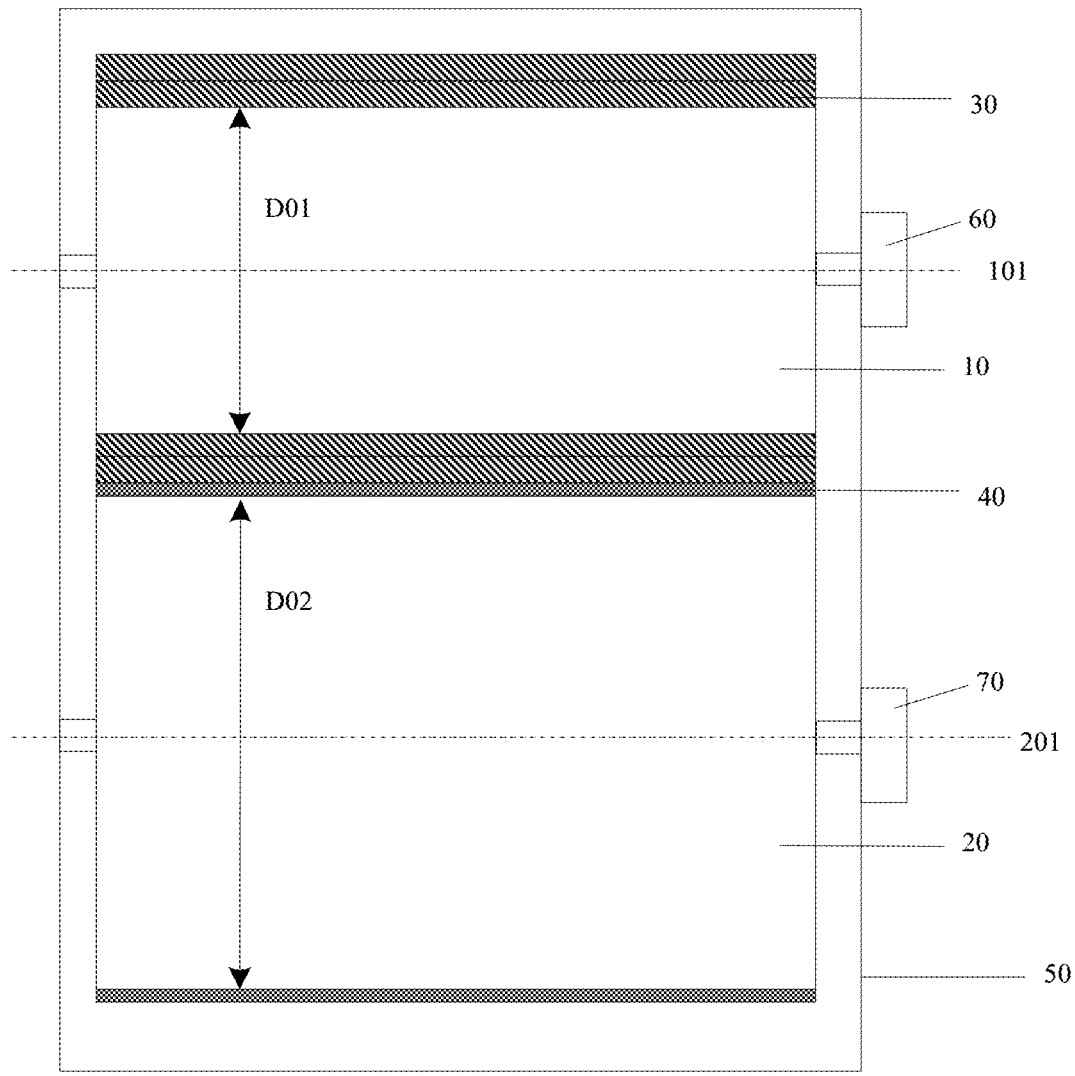
FIG. 3 is a schematic diagram of another viewing angle of a display device provided by an embodiment of the present disclosure.

FIG. 3 is a schematic diagram of another viewing angle of a display device provided by an embodiment of the present disclosure. As shown in FIG. 3, a first rotating component 10 may be configured with a first knob 60, and a second rotating component 20 may be configured with a second knob 70. The first knob 60 or the second knob 70 can be turned to drive the flexible display panel 30 and the supporting part 40 to move. When the first rotating component 10 and the second rotating component 20 have a same rotation direction, the same knob may also be utilized to make the first rotating component 10 and the second rotating component 20 rotate, so as to drive the flexible display panel 30 and the supporting part 40 to move.

For example, as shown in FIGS. 2 and 3, the first rotating component 10 and the second rotating component 20 are butted with each other through a portion of the flexible display panel 30 and a portion the supporting part 40 that are located between the first rotating component 10 and the second rotating component 20.

For example, as shown in FIGS. 2 and 3, the first rotating component 10 includes a first circular shaft, the second rotating component 20 includes a second circular shaft, and a diameter of the first circular shaft is smaller than that of the second circular shaft. As shown in FIG. 3, a diameter D01 of the first rotating component 10 is smaller than a diameter D02 of the second rotating component 20. Since the flexible display panel 30 and the supporting part 40 have different rigidity, the rigidity of the flexible display panel 30 being smaller than that of the supporting part 40, the first circular shaft having a smaller diameter may be employed to wind the flexible display panel 30, while the second circular shaft having a larger diameter is employed to wind the supporting part 40. Of course, in some embodiments, the diameter of the first circular shaft may be greater than or equal to that of the second circular shaft, which is not limited here.

For example, as shown in FIG. 3, the first rotating component 10 is rotatably fixed onto the housing 50, and the second rotating component 20 is rotatably fixed onto the housing 50. In the embodiment of the present disclosure, rotatable fixation of a certain element may refer to that its position is fixed but it can rotate at the position. For example, rotatable fixation of a certain element may refer to that a position of its center line is fixed, but it can rotate.

Figure 4:
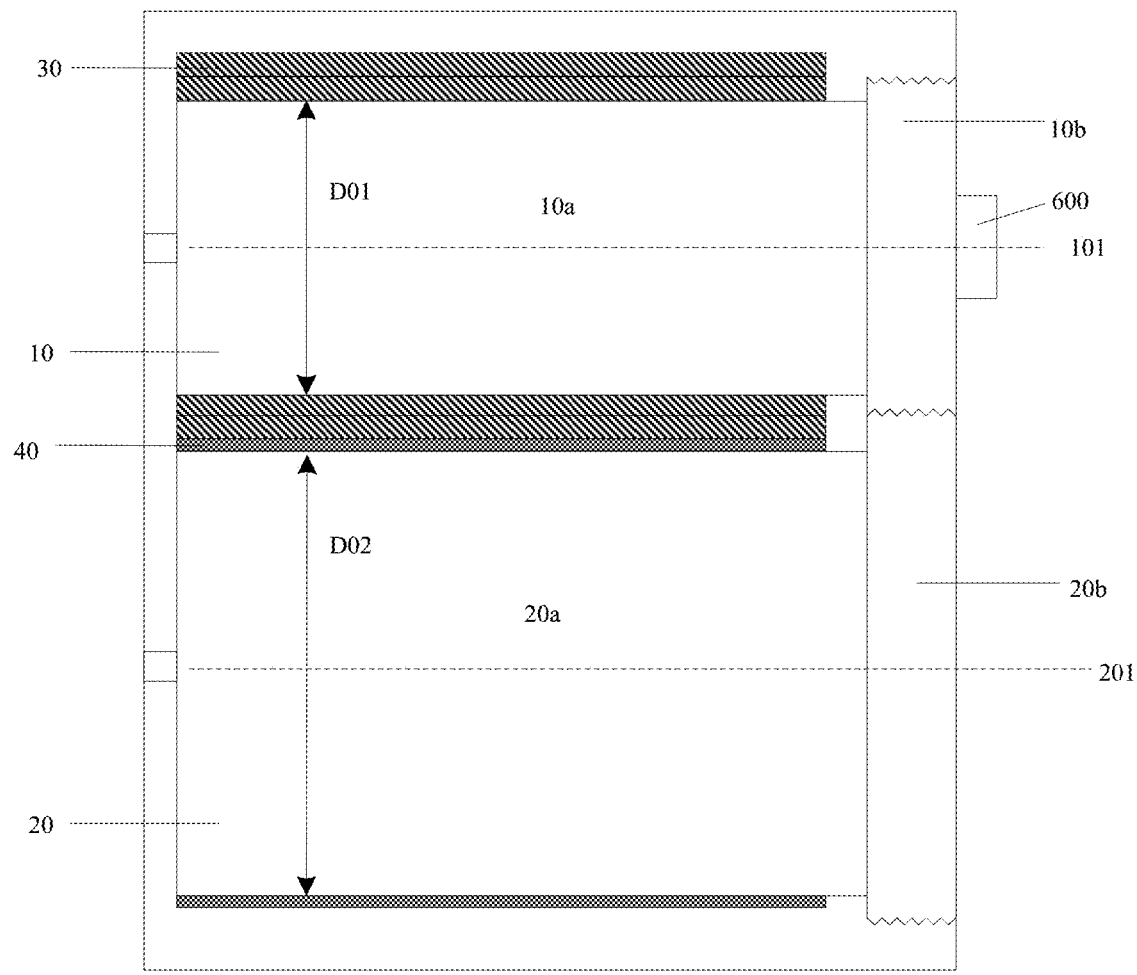
FIG. 4 is a schematic diagram of another display device provided by an embodiment of the present disclosure.

FIG. 4 is a schematic diagram of another display device provided by an embodiment of the present disclosure. As shown in FIG. 4, the first rotating component 10 includes a first portion 10a configured to wind a flexible display panel 30 and a second portion 10b configured not to wind the flexible display panel 30, a second rotating component 20 includes a first portion 20a configured to wind a supporting part 40 and a second portion 20b configured not to wind the supporting part 40, the second portion 10b includes a first gear, and the second portion 20b includes a second gear, and the first gear and the second the gear are engaged with each other, and thereby, a knob 600 can be configured for the first rotating component 10 or the second rotating component 20. The knob 600 may be connected with the first gear or the second gear. In FIG. 4, the first rotating component 10 being configured with the knob 600 is taken as an example. The knob 600 drives the first rotating component 10, and the first rotating component 10 drives the second rotating component 20 to rotate by gear transmission, so as to facilitate simultaneous movement of the display panel 30 and the supporting part 40.

Figure 5:
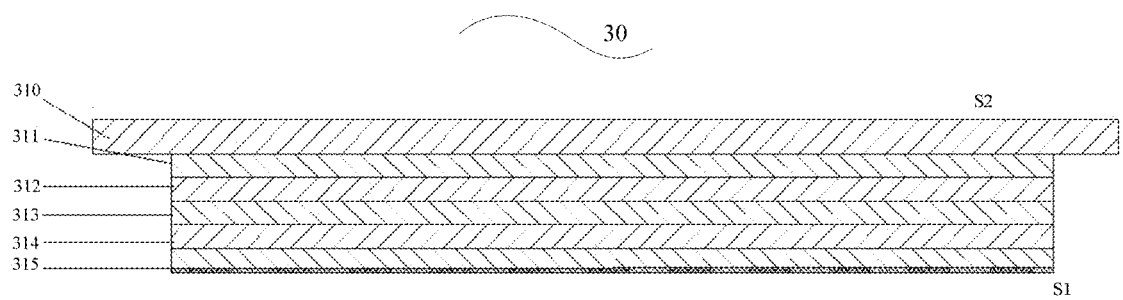
FIG. 5 is a schematic diagram of a flexible display panel in a display device provided by an embodiment of the present disclosure.

FIG. 5 is a schematic diagram of a flexible display panel in a display device provided by an embodiment of the present disclosure. As shown in FIG. 5, a flexible display panel 30 includes a flexible cover plate 310, an optical transparent adhesive layer 311, a touch functional layer 312, a polarizer layer 313, a light-emitting device layer 314 and a back film 315. For example, the light-emitting device layer 314 includes a plurality of organic light-emitting diodes (OLED), but is not limited thereto. For example, the back film 315 is located on a non-display side S1 of the flexible display panel 30, and the non-display side S1 is opposite to a display side S2 of the flexible display panel 30. For example, the back film 315 may be configured to be laminated to the supporting part 40 by an adsorption force or in an engaged manner With reference to FIGS. 5 and 3, the back film 315 is in contact with the supporting part 40. For example, in the embodiment of the present disclosure, the non-display side S1 is one side away from the first rotating component 10 when the flexible display panel 30 is wound around the first rotating component 10, and the display side S2 is one side close to the first rotating component 10 when the flexible display panel 30 is wound around the first rotating component 10.

Figure 6:
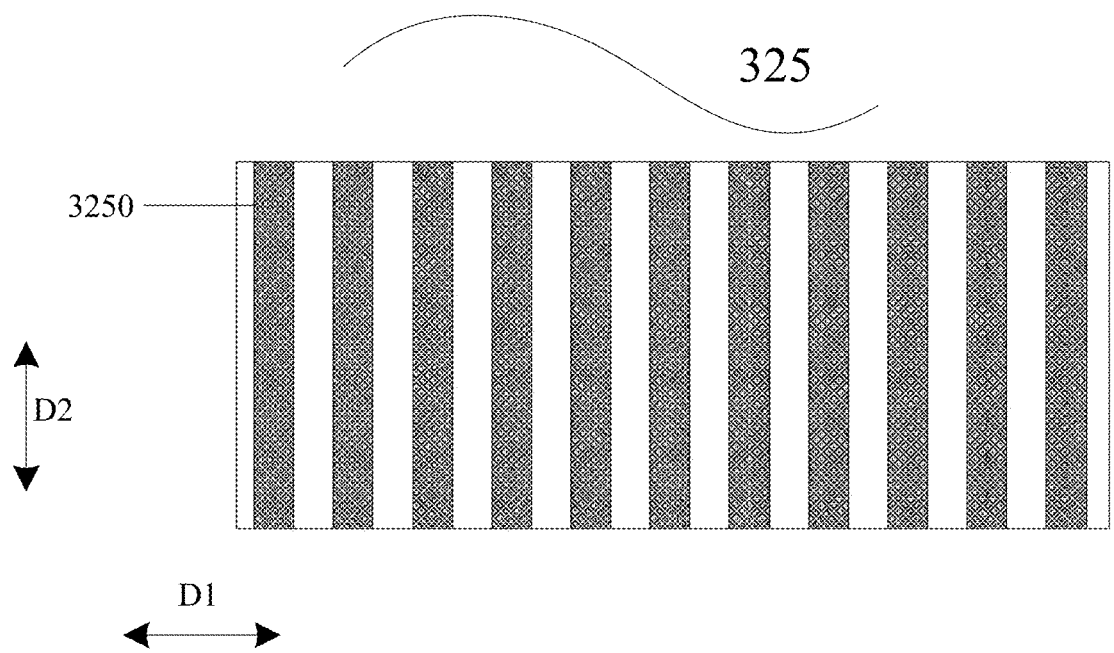
FIG. 6 is a schematic diagram of a back film of a flexible display panel in a display device provided by an embodiment of the present disclosure.

FIG. 6 is a schematic diagram of a back film of a flexible display panel in a display device provided by an embodiment of the present disclosure. For example, as shown in FIG. 6, a flexible display panel 30 includes a back film 325. For example, the back film 325 includes a magnetic material; the supporting part 40 includes a magnetic material; the back film 325 and the supporting part 40 may be laminated to each other under the action of an attraction force.

For example, as shown in FIG. 6, in order to save the material or reduce weight of the flexible display panel, the back film 325 includes a magnetic material pattern. The magnetic material pattern includes a plurality of magnetic stripes 3250 parallel to each other. The plurality of magnetic stripes 3250 are arranged along a first direction D1, and each of the plurality of magnetic stripes 3250 extends along a second direction D2. For example, the second direction D2 is perpendicular to the first direction D1.

Figure 7:
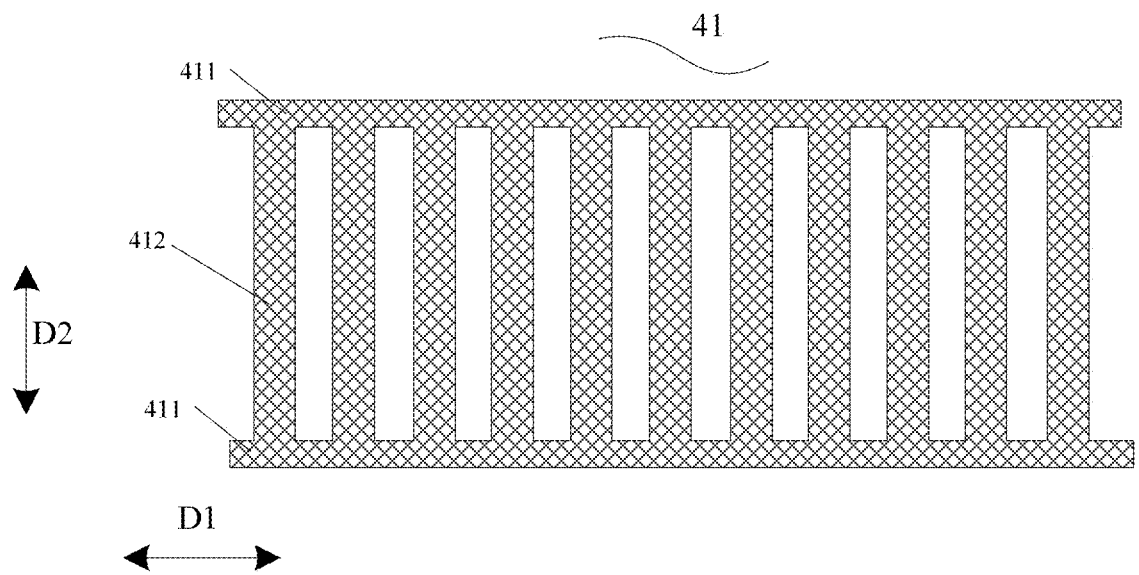
FIG. 7 is a schematic diagram of a supporting part of a flexible display panel in a display device provided by an embodiment of the present disclosure.

FIG. 7 is a schematic diagram of a supporting part of a flexible display panel in a display device provided by an embodiment of the present disclosure. For example, as shown in FIG. 7, the supporting part 41 includes two supporting pieces 411 extending along a first direction D1 and a plurality of connecting pieces 412 connecting the two supporting pieces 411, and the first direction D1 intersects with a second direction D2. For example, the second direction D2 is perpendicular to the first direction D1.

For example, as shown in FIG. 7, the two supporting pieces 411 are parallel to each other, and the plurality of connecting pieces 412 are parallel to each other, but are not limited thereto. The plurality of connecting pieces 412 may not be parallel to each other.

For example, with reference to FIGS. 6 and 7, when the flexible display panel 30 and the supporting part 40 are gradually laminated, each connecting piece 412 may adsorb on one magnetic stripe 3250. For example, in order to facilitate adsorption, a size of one magnetic stripe 3250 in the first direction D1 is equal to that of one connecting piece 412 in the first direction D1, but is not limited thereto.

Figure 8:
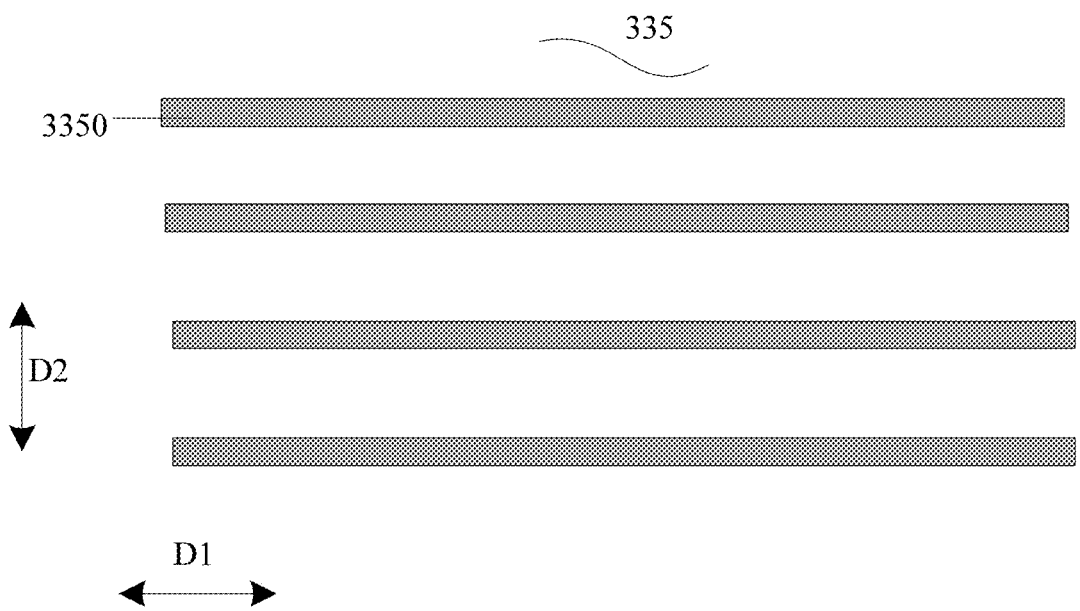
FIG. 8 is a schematic diagram of a back film of a flexible display panel in a display device provided by an embodiment of the present disclosure.

FIG. 8 is a schematic diagram of a back film of a flexible display panel in a display device provided by an embodiment of the present disclosure. For example, as shown in FIG. 8, a flexible display panel 30 includes a back film 335. For example, the back film 335 includes a magnetic material; the supporting part 40 includes a magnetic material; the back film 335 and the supporting part 40 may be laminated to each other under the action of an attraction force. For example, as shown in FIG. 8, the back film 335 includes a magnetic material pattern. The magnetic material pattern includes a plurality of magnetic stripes 3350 parallel to each other. Each of the plurality of magnetic stripes 3250 extends along a first direction D1, and the plurality of magnetic stripes 3350 are arranged along a second direction D2. For example, the second direction D2 is perpendicular to the first direction D1. The back film 335 shown in FIG. 8 and the supporting part 41 shown in FIG. 7 may be adsorbed to each other.

In the embodiment of the present disclosure, the number and sizes of the magnetic stripes or a distance between the magnetic stripes in the magnetic material pattern are not limited.

Figure 9:
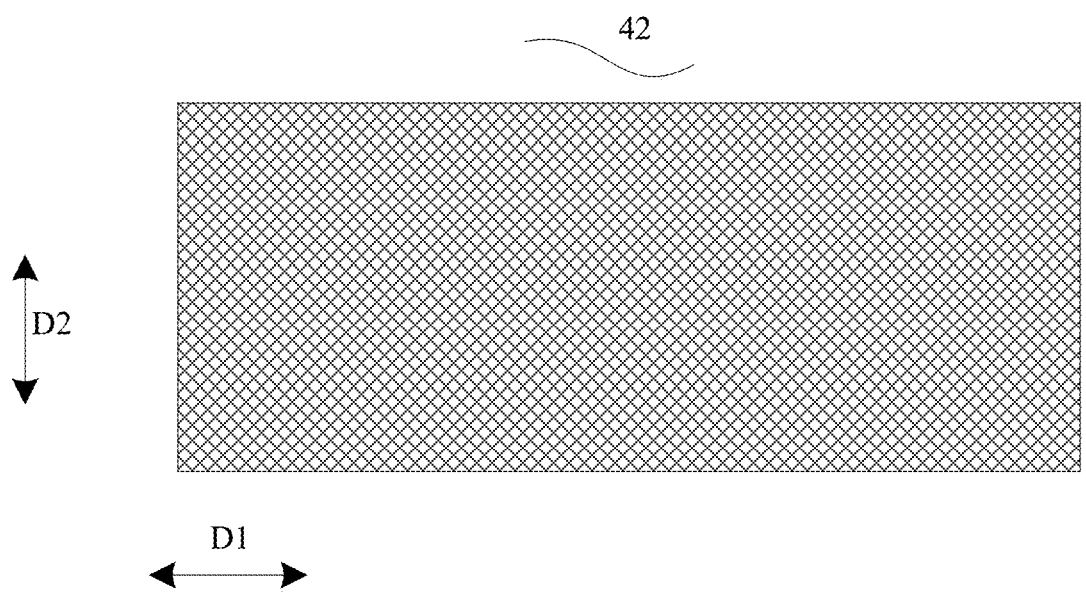
FIG. 9 is a schematic diagram of a supporting part in a display device provided by an embodiment of the present disclosure.

FIG. 9 is a schematic diagram of a supporting part in a display device provided by an embodiment of the present disclosure. As shown in FIG. 9, the supporting part 42 is of a plate-like structure. The supporting part 42 shown in FIG. 9 and the back film shown in FIG. 8 or 6 can be adsorbed to each other.

In addition to a way that the back film and the supporting part are adsorbed to each other, the back film and the supporting part can also be laminated together in a manner of being engaged with each other.

Figure 10:
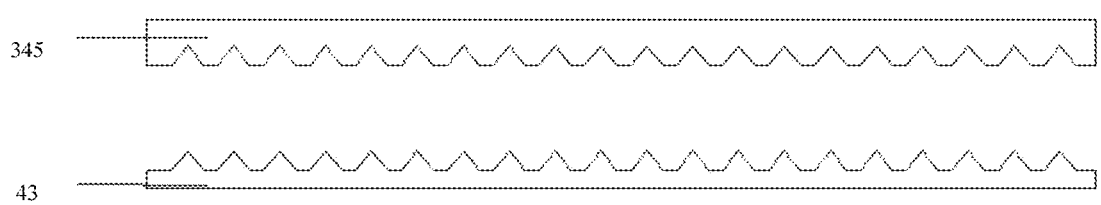
FIG. 10 is a schematic diagram of a flexible display panel and a supporting part in a display device provided by an embodiment of the present disclosure.

FIG. 10 is a schematic diagram of a flexible display panel and a supporting part in a display device provided by an embodiment of the present disclosure. For example, as shown in FIG. 10, a back film 345 includes a first toothed rack structure, the supporting part 40 includes a second toothed rack structure, and the first toothed rack structure and the second toothed rack structure are engaged with each other. In the embodiment of the present disclosure, shapes, the number, positions and sizes of engaged teeth of the first toothed rack structure are not limited. Shapes, the number, positions and sizes of engaged teeth of the second toothed rack structure are not limited.

For example, when the flexible display panel 30 is pulled out, the supporting part 40 is combined together with the supporting part 40 through a magnetic force or a tooth slot, and when the flexible display panel 30 is pulled out, the supporting part 40 is located at the bottom of the flexible display panel 30, which not only makes the flexible display panel 30 have better flatness, but also improves the user experience.

Figure 11:
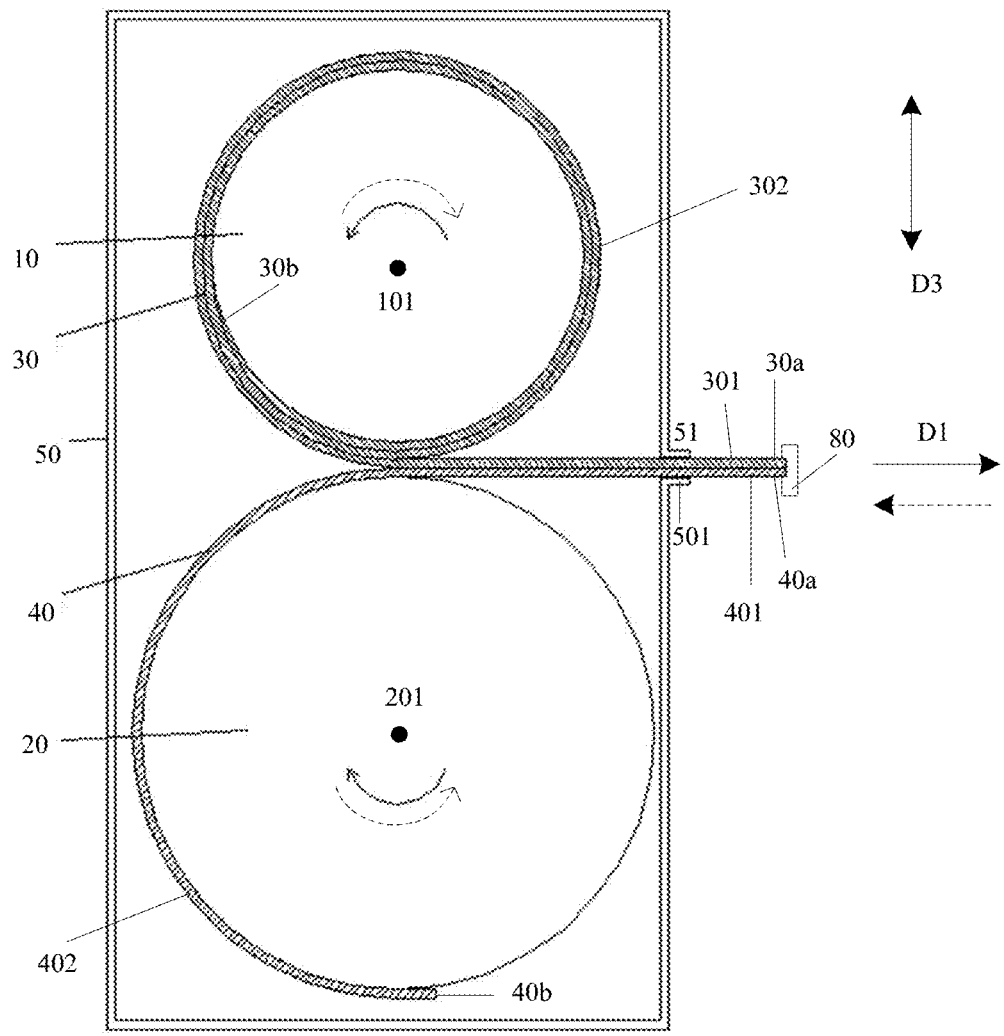
FIG. 11 is a schematic diagram of a flexible display panel and a supporting part in a display device provided by an embodiment of the present disclosure.

FIG. 11 is a schematic diagram of a flexible display panel and a supporting part in a display device provided by an embodiment of the present disclosure. For example, the display device further comprises a connecting component 80, the connecting component 80 is located outside a housing 50, and the connecting component 80 is connected with a first end 30a of a flexible display panel 30 and a first end 40a of a supporting part 40. For example, the connecting component 80 is fixedly connected with the first end 30a of the flexible display panel 30 and the first end 40a of the supporting part 40. For example, a size of the connecting component 80 in a third direction D3 is larger than that of an opening 51 in the third direction D3, thereby facilitating pushing and pulling of the flexible display panel 30 and the supporting part 40, or preventing the flexible display panel 30 and the supporting part 40 from completely entering the housing 50. For example, the third direction D3 is perpendicular to a first direction D1, and the third direction D3 is perpendicular to a second direction D2. For example, the third direction can also be regarded as a direction perpendicular to a plane where the laminated portion 43 is located.

It is illustrated with that the first rotating component 10 and the second rotating component 20 have opposite rotation directions as an example above, and the embodiment of the present disclosure is not limited thereto. In other embodiments, the first rotating component 10 and the second rotating component 20 may have a same rotation direction.

Figure 12:
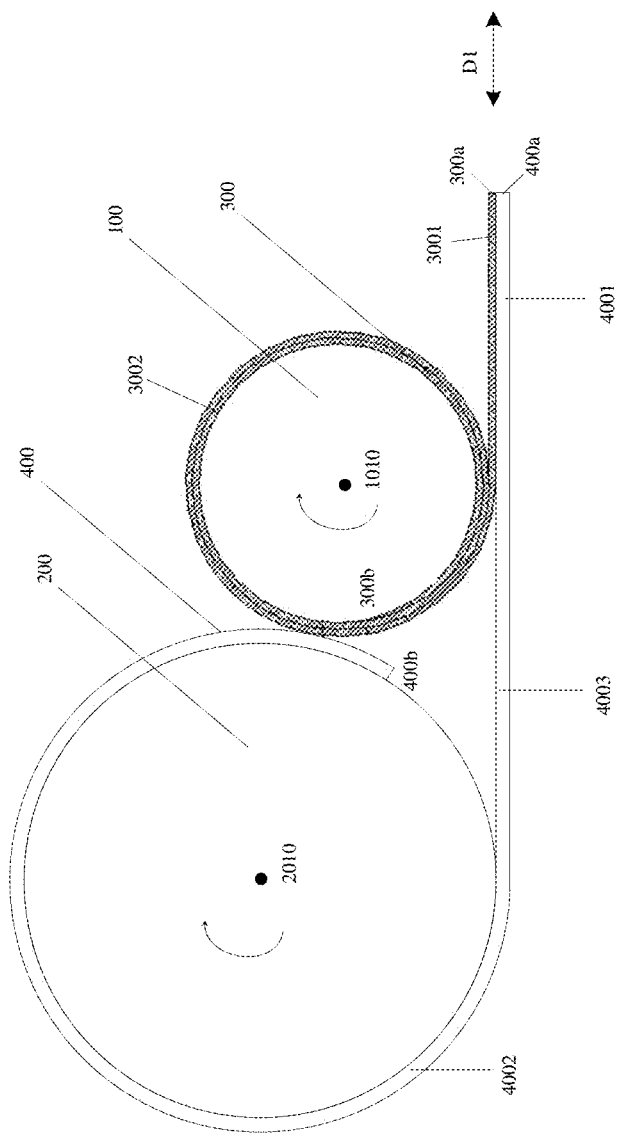
FIG. 12 is a schematic diagram of a display device provided by another embodiment of the present disclosure.

FIG. 12 is a schematic diagram of a display device provided by another embodiment of the present disclosure. For example, as shown in FIG. 12, the display device comprises: a first rotating component 100, a second rotating component 200, a flexible display panel 300 and a supporting part 400. The first rotating component 100 may rotate about a first center line 1010. The second rotating component 200 may rotate around a second center line 2010. The flexible display panel 300 may be wound around the first rotating component 100, and a first end 300a of the flexible display panel 300 is configured to move to a position away from the first rotating component 100 from a position close to the first rotating component 100 or to move to a position close to the first rotating component 100 from a position away from the first rotating component 100 under the action of an external force. For example, the first end 300a of the flexible display panel 300 is configured to gradually get close to the first rotating component 100 or to gradually move away from the first rotating component 100 under the action of the external force. The supporting part 400 may be wound around the second rotating component 200, and a first end 400a of the supporting part 400 is configured to move to a position away from the second rotating component 200 from a position close to the second rotating component 200 or move to a position close to the second rotating component 200 from a position away from the second rotating component 200 under the action of an external force. The first end 400a of the supporting part 400 is configured to gradually get close to the second rotating component 200 or to gradually move away from the second rotating component 200 under the external force. The flexible display panel 300 further includes a second end 300b, and the supporting part 400 further includes a second end 400b.

For example, as shown in FIG. 12, the first rotating component 10 and the second rotating component 20 have a same rotation direction, and a first portion 301 of the flexible display panel 30 and a first portion 401 of the supporting part 40 are located on a same side of the first rotating component 10 and the second rotating component 20.

As shown in FIG. 12, the flexible display panel 300 includes a first portion 3001 unwound around the first rotating component 100 and a second portion 3002 wound around the first rotating component 100, and the supporting part 400 includes a first portion 4001 unwound around the second rotating component 200 and a second portion 4002 wound around the second rotating component 200, and the first portion 3001 of the flexible display panel 300 and the first portion 4001 of the supporting part 400 are laminated to each other.

In the display device shown in FIG. 12, the first portion 3001 of the flexible display panel 300 and the first portion 4001 of the supporting part 400 are laminated to each other, and the supporting part 40 supports the flexible display panel 300, and thereby, the flexible display panel 300 has higher rollability when being rolled, and has smaller warpage when being unfolded, which is conducive to improving a display effect and the user experience.

Figure 13:
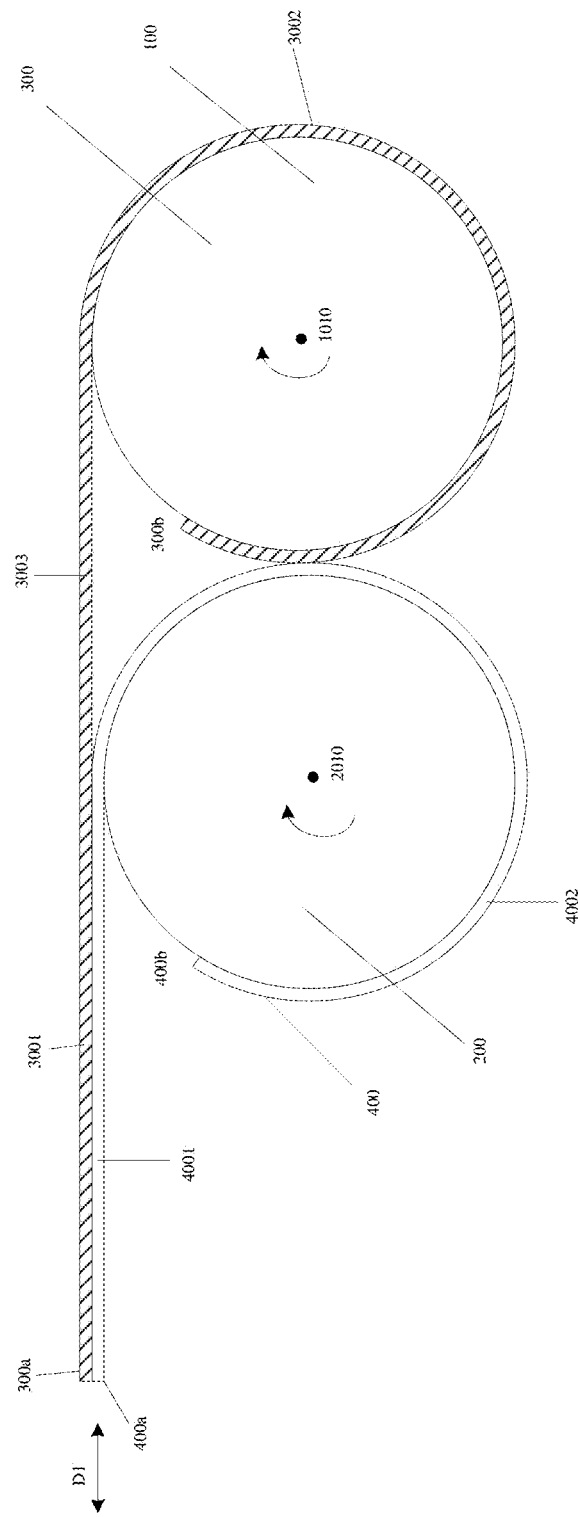
FIG. 13 is a schematic diagram of a display device provided by another embodiment of the present disclosure.

FIG. 13 is a schematic diagram of a display device provided by another embodiment of the present disclosure. Description of the embodiment of the present disclosure may refer to description of FIG. 12, which will not be repeated here. The embodiment shown in FIG. 13 is different from the embodiments shown in FIGS. 2 and 12 with a case where a display side of a flexible display panel 30 is one side away from the first rotating component 10 when the flexible display panel 30 is wound around the first rotating component 10, while a non-display side of the flexible display panel 30 is one side close to the first rotating component 10 when the flexible display panel 30 is wound around the first rotating component 10.

The embodiment of the present disclosure does not limit that the first portion of the flexible display panel unwound around the first rotating component and the first portion of the supporting part unwound around the second rotating component are completely laminated to each other. As shown in FIG. 12, the supporting part 40 further includes a third portion 4003, both ends of the third portion 4003 of the supporting part 40 are connected with the first portion 4001 and the second portion 4002 respectively, and the third portion 4003 of the supporting part 40 is neither wound around the second rotating component, nor laminated to the first portion 3001 of the flexible display panel. As shown in FIG. 13, the flexible display panel 30 further includes a third portion 3003, both ends of the third portion 3003 of the flexible display panel 30 are connected with the first portion 3001 and the second portion 3002 respectively, and the third portion 3003 of the flexible display panel 30 is neither wound around the first rotating component, nor laminated to the first portion 4001 of the supporting part 40. In the embodiment shown in FIG. 2, when an orthographic projection of the first center line 101 on the bottom surface of the housing 50 is not overlapped with the orthographic projection of the second center line 201 on the bottom surface of the housing 50, the flexible display panel 30 may also include a third portion neither wound around the first rotating component nor laminated to the supporting part, or, the supporting part 40 may also include a third portion neither wound around the second rotating component nor laminated to the flexible display panel 30.

In the embodiments of the present disclosure, in the display devices shown in FIGS. 12 and 13, the housing can also be provided, which may refer to description of FIG. 2 and will not be repeated here.

In the embodiment of the present disclosure, the position close to the first rotating component 10 and the position away from the first rotating component 10 are not definite positions, and may be any position within a plane formed by the first direction D1 and the second direction D2, as long as a distance between the position close to the first rotating component 10 and the first rotating component 10 is less than a distance between the position away from the first rotating component 10 and the first rotating component 10.

In the embodiment of the present disclosure, the position close to the second rotating component 20 and the position away from the second rotating component 20 are not definite positions, as long as a distance between the position close to the second rotating component 20 and the second rotating component 20 is less than a distance between the position away from the second rotating component 20 and the second rotating component 20.

In the embodiment of the present disclosure, the first direction D1 may be a direction parallel to the drawing paper, the second direction D2 may be a direction perpendicular to the drawing paper, and the third direction D1 may be a direction parallel to the drawing paper. For example, the first direction D1 is a horizontal direction, and the third direction D1 is a vertical direction.

Without conflict, features in a same embodiment and different embodiments of the present disclosure can be combined with each other.

The foregoing is only the preferred embodiments of the present invention and not intended to limit the scope of protection of the present invention. Any change or replacement that may be easily thought of by those skilled in the art within the technical scope disclosed by the present invention shall fall within the scope of protection of the present invention. Therefore, the scope of protection of the present invention shall be defined by the appended claims.

The invention claimed is:

1. A display device, comprising:
   a first rotating component, the first rotating component being capable of rotating about a first center line;
   a second rotating component, the second rotating component being capable of rotating about a second center line;
   a flexible display panel, the flexible display panel being capable of being wound around the first rotating component, and a first end of the flexible display panel being configured to move to a position away from the first rotating component from a position close to the first rotating component or to move to a position close to the first rotating component from a position away from the first rotating component under an action of an external force;
   a supporting part, the supporting part being capable of being wound around the second rotating component, and a first end of the supporting part being configured to move to a position away from the second rotating component from a position close to the second rotating component or to move to a position close to the second rotating component from a position away from the second rotating component under the action of the external force;

wherein the flexible display panel and the supporting part have a laminated portion in mutual lamination, and the laminated portion is configured to increase or decrease under the action of the external force, wherein the flexible display panel includes a back film, the back film is located on a non-display side of the flexible display panel, and the non-display side and a display side of the flexible display panel are opposite to each other; the back film is in contact with the supporting part, wherein the back film includes a magnetic material; the supporting part includes a magnetic material; the back film and the supporting part are capable of being laminated to each other under an action of an attraction force, wherein the back film includes a magnetic material pattern, wherein the magnetic material pattern includes a plurality of magnetic stripes parallel to each other, wherein the plurality of magnetic stripes are arranged along a first direction, each of the plurality of magnetic stripes extends along a second direction; or, each of the plurality of magnetic stripes extends along the first direction, the plurality of magnetic stripes are arranged along the second direction, and the first direction intersects with the second direction, the supporting part includes two supporting pieces extending along the first direction and a plurality of connecting pieces connecting the two supporting pieces, and the supporting part includes a plurality of opening regions between the two supporting pieces and the plurality of connecting pieces, and the supporting part is configured to attract the magnetic strips in the back film.

2. The display device according to claim 1, wherein the flexible display panel includes a first portion unwound around the first rotating component, the supporting part includes a first portion unwound around the second rotating component, and the first portion of the flexible display panel and the first portion of the supporting part are at least partially laminated to each other to form the laminated portion.

3. The display device according to claim 2, wherein the first portion of the flexible display panel and the first portion of the supporting part are at least partially in contact, and the first end of the flexible display panel is in contact with the first end of the supporting part.

4. The display device according to claim 2, wherein the first rotating component and the second rotating component have opposite rotation directions, and the first portion of the flexible display panel and the first portion of the supporting part are located between the first rotating component and the second rotating component; or, the first rotating component and the second rotating component have a same rotation direction, the first portion of the flexible display panel and the first portion of the supporting part are located on a same side of the first rotating component and the second rotating component.

5. The display device according to claim 1, wherein at least one of the first rotating component, the second rotating component, the flexible display panel and the supporting part is configured to receive the external force.

6. The display device according to claim 1, wherein at least one of the flexible display panel and the supporting part is configured to receive the external force, and the first rotating component is configured to rotate with movement of the first end of the flexible display panel, and the second rotating component is configured to rotate with movement of the first end of the supporting part; or, at least one of the first rotating component and the second rotating component is configured to receive the external force, and the first end of the flexible display panel is configured to move with rotation of the first rotating component, and the first end of the supporting part is configured to move with rotation of the second rotating component.

7. The display device according to claim 1, wherein an elastic modulus of the flexible display panel is smaller than that of the supporting part.

8. The display device according to claim 1, wherein the first center line and the second center line are parallel to each other.

9. The display device according to claim 1, wherein the first rotating component and the second rotating component are butted with each other through a portion of the flexible display panel and a portion of the supporting part that are located between the first rotating component and the second rotating component.

10. The display device according to claim 1, wherein the flexible display panel further includes a second portion wound around the first rotating component, and the supporting part further includes a second portion wound around the second rotating component;

the second portion of the flexible display panel is configured to be gradually wound around the first rotating component upon the first end of the flexible display panel moving to a position close to the first rotating component from a position away from the first rotating component, the second portion of the supporting part is configured to be gradually wound around the second rotating component upon the first end of the supporting part moving to a position close to the second rotating component from a position away from the rotating component.

11. The display device according to claim 1, further comprising a housing, wherein the housing has an opening; the laminated portion is configured to be pulled out from the opening, wherein the first rotating component and the second rotating component are located in the housing.

12. The display device according to claim 11, wherein the housing includes an opening forming portion, the opening forming portion is configured to form the opening, and one side of the opening forming portion close to the supporting part includes a magnetic material.

13. The display device according to claim 1, wherein a material of the supporting part includes a metal material.

14. The display device according to claim 1, wherein the first rotating component includes a first portion configured to wind the flexible display panel and a second portion configured not to wind the flexible display panel, the second rotating component includes a first portion configured to wind the supporting part and a second portion configured not to wind the supporting part, the second portion of the first rotating component includes a first gear, the second portion of the second rotating component includes a second gear, and the first gear and the second gear are engaged with each other.

15. The display device according to claim 1, wherein the first end of the flexible display panel and the first end of the supporting part are configured to move simultaneously; or, the first rotating component and the second rotating component are configured to move simultaneously.

* * * * *